United States Patent
Park

(10) Patent No.: US 11,532,360 B2
(45) Date of Patent: Dec. 20, 2022

(54) MEMORY SYSTEM, MEMORY DEVICE, AND METHOD FOR OPERATING MEMORY DEVICE

(71) Applicant: SK hynix Inc., Icheon-si (KR)

(72) Inventor: Chi Je Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 61 days.

(21) Appl. No.: 17/157,630

(22) Filed: Jan. 25, 2021

(65) Prior Publication Data

US 2022/0028457 A1 Jan. 27, 2022

(30) Foreign Application Priority Data

Jul. 27, 2020 (KR) .................. 10-2020-0092868

(51) Int. Cl.
| | | |
|---|---|---|
| *G11C 16/04* | (2006.01) | |
| *G11C 16/10* | (2006.01) | |
| *G11C 16/26* | (2006.01) | |
| *G11C 16/34* | (2006.01) | |
| *G11C 16/32* | (2006.01) | |
| *G11C 16/30* | (2006.01) | |

(52) U.S. Cl.
CPC .............. *G11C 16/10* (2013.01); *G11C 16/26* (2013.01); *G11C 16/30* (2013.01); *G11C 16/32* (2013.01); *G11C 16/3454* (2013.01)

(58) Field of Classification Search
CPC ......... G11C 16/10; G11C 16/26; G11C 16/30; G11C 16/32; G11C 16/3454
See application file for complete search history.

(56) References Cited

U.S. PATENT DOCUMENTS

| | | | |
|---|---|---|---|
| 10,061,538 B2* | 8/2018 | Park ................... | G11C 11/5635 |
| 10,366,769 B2* | 7/2019 | Cho ................... | G11C 16/3481 |
| 11,101,007 B2* | 8/2021 | Lee ................... | G11C 16/16 |

FOREIGN PATENT DOCUMENTS

| | | |
|---|---|---|
| KR | 10-2012-0058157 A | 6/2012 |
| KR | 10-2019-0064033 A | 6/2019 |

* cited by examiner

*Primary Examiner* — Pho M Luu
(74) *Attorney, Agent, or Firm* — Perkins Coie LLP

(57) ABSTRACT

When programming data in a first memory cell in a first memory block in a turbo program mode, the memory device may apply a first number of program pulses to the first memory cell, the first number of program pulses being smaller than the number of program pulses applied to the first memory cell when data is written to the first memory cell when the turbo program mode is reset. When migrating the data written to the first memory cell to a second memory cell in a second memory block, the memory device may apply a second number of program pulses to the second memory cell, the second number of program pulses being larger than the first number of program pulses.

16 Claims, 12 Drawing Sheets

① : program data to MC_1
② : migrate data from MC_1 to MC_2

*FIG. 7*

| TM | # of pulse |
|---|---|
| < (1 day) | 1 |
| (1 day) ~ (3 day) | 3 |
| (3 day) ~ (7 day) | 5 |
| > (7 day) | 7 |

MEMORY SYSTEM, MEMORY DEVICE, AND METHOD FOR OPERATING MEMORY DEVICE

CROSS REFERENCE TO RELATED APPLICATION

This patent document claims priority and benefits of Korean patent application number 10-2020-0092868 filed on Jul. 27, 2020, which is incorporated herein by reference in its entirety.

TECHNICAL FIELD

Embodiments of the disclosed technology relate to a memory system, a memory device, and a method for operating a memory device.

BACKGROUND

A memory system includes a data storage device that stores data on the basis of a request from a host, such as computers, servers, smartphones or tablet PCs, or other electronic devices. The examples of the memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling the memory device. The memory controller may receive a command from the host and, on the basis of the received command, may execute the command or control read/write/erase operations on the memory device (volatile memory and/or nonvolatile memory) included in the memory system. The memory controller may execute firmware operations for performing a logical operation for controlling such operations.

With an increase in the speed of data communications between memory systems and hosts, the memory systems are required to offer better performance to satisfy the quality of service (QoS) requirements of the hosts. In an effort to satisfy such requirements of the memory systems, various technologies are being developed to increase the write speed and data storage capacity of the memory systems.

SUMMARY

The technology disclosed in this patent document can be implemented in some embodiments of the disclosed technology may provide a memory system, a memory device, and a method for operating a memory device that can offer a faster write speed.

In addition, embodiments of the disclosed technology may provide a memory system, a memory device, and a method for operating a memory device that can greatly increase the speed of write operations without compromising the reliability of the write operations.

In an aspect, a memory system is disclosed. The memory system may include a memory device and a memory controller in communication with the memory device and configured to control the memory device to perform an operation.

The memory device may include a first memory block and a second memory block, each of the first and second memory blocks including memory cells for storing data and operable to perform an operation on one or more memory cells, including a read operation for reading data stored in one or more memory cells and a program operation for writing new data into one or more memory cells.

The memory controller may determine whether to set or reset a turbo program mode, and may determine, in the turbo program mode, a number of program pulses applied when data is written to the first memory block.

The memory device may apply a first number of program pulses to a first memory cell included in the first memory block when writing data into the first memory cell in a state in which the turbo program mode is set.

The memory device may apply a second number of program pulses to a second memory cell included in the second memory block when migrating the data from the first memory cell to the second memory cell.

The first number of program pulses may be smaller than a number of program pulses applied when data is written to the first memory cell in a state in which the turbo program mode is reset.

The second number of program pulses may be larger than the first number of program pluses.

A number of data bits stored in the first memory cell may be smaller than a number of data bits stored in the second memory cell.

The memory device may determine the first number of program pulses based on a maximum maintenance time corresponding to a maximum time during which data is retained in the first memory cell.

The program pulse may be ISPP (incremental step pulse program) voltage pulses. The memory device may determine a voltage difference between the program pulses to be applied to the first memory cell based on the maximum maintenance time.

The memory device may differently determine a time point to migrate data from the first memory cell to the second memory cell based on how frequently the data stored in the first memory cell is accessed.

The memory device may migrate data from the first memory cell to the second memory cell when the memory device is in an idle state.

In another aspect, a memory device is disclosed.

The memory device may include a first memory block including first memory cells for storing data and operable to perform a program operation for writing data into the memory cells and a second memory block including second memory cells for storing data and operable to perform a program operation for writing data into the memory cells.

The memory device may apply a first number of program pulses to a first memory cell included in the first memory block when writing data into the first memory cell in a state in which a turbo program mode is set, wherein the turbo program mode may be configured to determine a number of program pulses to be applied to the first memory block.

The memory device may apply a second number of program pulses to a second memory cell included in the second memory block when migrating the data from the first memory cell to the second memory cell.

The first number of program pulses may be smaller than a number of program pulses applied when data is written to the first memory cell in a state in which the turbo program mode is reset.

The second number of program pulses may be larger than the first number of program pulses.

In another aspect, a method for operating a memory device including a first memory block and a second memory block is disclosed.

The method for operating a memory device may include a step of writing data by applying a first number of program pulses to a first memory cell included in the first memory block in a state in which a turbo program mode is set, wherein the turbo program mode may be configured to determine a number of program pulses applied when data is written to the first memory block.

In addition, the method for operating a memory device may include a step of migrating the data from the first memory cell to a second memory cell included in the second memory block by applying a second number of program pulses to the second memory cell.

The first number of program pulses may be smaller than a number of program pulses applied when data is written to the first memory cell in a state in which the turbo program mode is reset.

The second number of program pulses may be larger than the first number of program pulses.

A number of data bits stored in the first memory cell may be smaller than a number of data bits stored in the second memory cell.

The first number of program pulses may be determined based on a maximum maintenance time corresponding to a maximum time during which data is retained in the first memory cell.

The program pulses may be ISPP (incremental step pulse program) voltage pulses. The voltage difference between program pulses to be applied to the first memory cell may be determined based on the maximum maintenance time.

In another aspect, a memory system is disclosed. The memory system may include a memory device and a memory controller configured to control the memory device.

The memory device may include a first memory block and a second memory block.

The memory controller may determine whether to set or reset a turbo program mode, the turbo program mode being a mode for determining the number of ISPP program pulses applied when data is programmed in the first memory block.

The memory device may apply a first pulse number of ISPP program pulses to a first memory cell included in the first memory block when programming data in the first memory cell in a state in which the turbo program mode is set.

The memory device may apply a second pulse number of ISPP program pulses to a second memory cell included in the second memory block when migrating the data programmed in the first memory cell to the second memory cell.

The first pulse number is smaller than the number of ISPP program pulses applied to the first memory cell when data is programmed in the first memory cell in a state in which the turbo program mode is reset.

The second pulse number is larger than the first pulse number.

The bit number of data stored in the first memory cell may be smaller than the bit number of data stored in the second memory cell.

The memory device may determine the first pulse number on the basis of a maximum maintenance time, the maximum maintenance time being a maximum value of a time during which data programmed in the first memory cell can be maintained in the first memory cell.

The memory device may determine, on the basis of the maximum maintenance time, a voltage difference between ISPP program pulses applied when data is written to the first memory cell.

The memory device may differently determine a time point to migrate data from the first memory cell to the second memory cell based on whether or not the data stored in the first memory cell is cold data.

The memory device may migrate data programmed in the first memory cell to the second memory cell when in an idle state.

In another aspect, a memory device is disclosed.

The memory device may include a first memory block and a second memory block.

The memory device may apply a first pulse number of ISPP program pulses to a first memory cell included in the first memory block when programming data in the first memory cell in a state in which a turbo program mode is set, the turbo program mode being a mode for determining the number of ISPP program pulses applied when data is programmed in the first memory block.

The memory device may apply a second pulse number of ISPP program pulses to a second memory cell included in the second memory block when migrating the data programmed in the first memory cell to the second memory cell.

The first pulse number is smaller than the number of ISPP program pulses applied to the first memory cell when data is programmed in the first memory cell in a state in which the turbo program mode is reset.

The second pulse number is larger than the first pulse number.

In another aspect, a method for operating a memory device including a first memory block and a second memory block is disclosed.

The method for operating a memory device may include a step of programming data by apply a first pulse number of ISPP program pulses to a first memory cell included in the first memory block in a state in which a turbo program mode is set, the turbo program mode being a mode for determining the number of ISPP program pulses applied when data is programmed in the first memory block.

In addition, the method for operating a memory device may include a step of migrating the data programmed in the first memory cell to a second memory cell included in the second memory block by applying a second pulse number of ISPP program pulses to the second memory cell.

The first pulse number is smaller than the number of ISPP program pulses applied to the first memory cell when data is programmed in the first memory cell in a state in which the turbo program mode is reset.

The second pulse number is larger than the first pulse number.

The bit number of data stored in the first memory cell may be smaller than the bit number of data stored in the second memory cell.

The first pulse number may be determined on the basis of a maximum maintenance time, the maximum maintenance time being a maximum value of a time during which data programmed in the first memory cell can be maintained in the first memory cell.

The voltage difference between ISPP program pulses applied when data is programmed in the first memory cell may be determined on the basis of the maximum maintenance time.

BRIEF DESCRIPTION OF THE DRAWINGS

FIG. 7 is a diagram illustrating an example of the first pulse number based on the maximum maintenance time in some embodiments of the disclosed technology.

DETAILED DESCRIPTION OF THE EXEMPLARY EMBODIMENTS

Hereinafter, embodiments of the disclosed technology will be described in detail with reference to the accompanying drawings.

Figure 1:
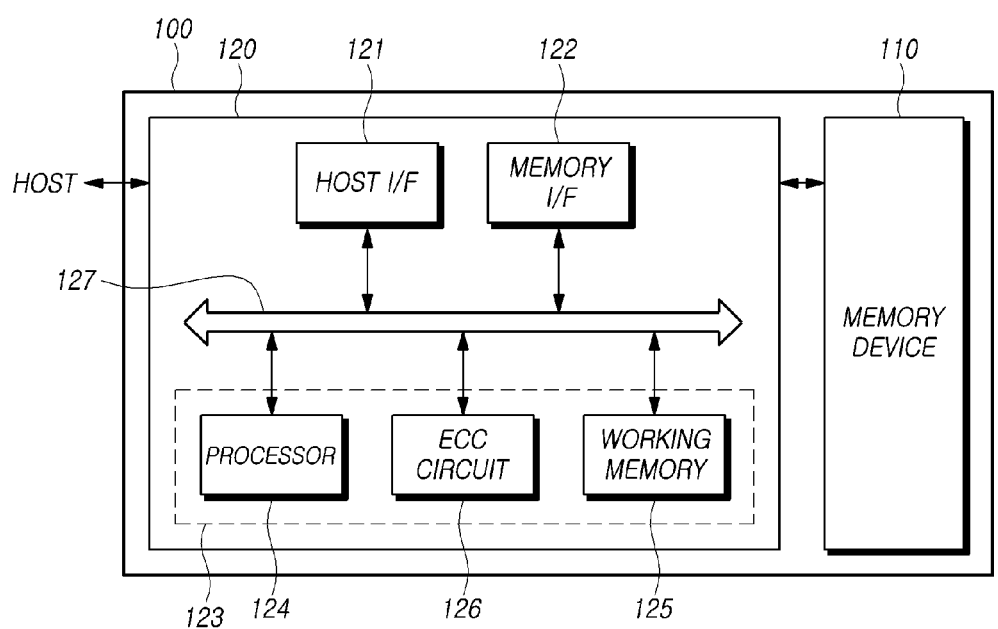
FIG. 1 is a schematic diagram illustrating a configuration of a memory system based on an embodiment of the disclosed technology.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a predetermined number of memory cells for storing data. The memory device 110 may be configured to operate in response to control signals received from the memory controller 120. Operations of the memory device 110 may include, for example, a read operation for reading data stored in one or more memory cells, a program operation for writing new data into one or more memory cells (also referred to as a "write operation"), an erasure operation for deleting or erasing data stored in one or more memory cells.

The memory cells in the memory device 110 may be used to store data and may be arranged in a memory cell array including multiple memory cells. In some implementations where the memory device 110 is a flash memory device, the memory cell array may be divided into memory blocks of memory cells and each block includes different pages of memory cells. In some implementations of NAND flash memory devices, a page of cells is the smallest memory unit that can be programmed (or written) and read, and the data stored in memory cells can be erased at the block level.

In some implementations, the memory device 110 may be implemented as various types, such as a double data rate synchronous dynamic random access memory (DDR SDRAM), a low power double data rate fourth generation (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a conductive floating gate. In another implementations, the electric charge storage layer may be formed of an insulating material, and such a flash memory device is often called a charge trap flash (CTF).

The memory device 110 may be configured to receive a command and an address from the memory controller 120 to access an area of the memory cell array selected using the address. That is, the memory device 110 may perform an operation corresponding to the received command on a memory area in the memory device having a physical address corresponding to the received address from the memory controller 120.

In some implementations, the memory device 110 may perform a program (write) operation, a read operation, an erasure operation, and the like. During the program operation, the memory device 110 may program data in a memory location selected by the address. During the read operation, the memory device 110 may read data from the area selected by the address. During the erasure operation, the memory device 110 may erase data stored in a memory location selected by the address.

The memory controller 120 may control write (program), read, erasure, and background operations to be performed on the memory device 110. The background operation may include operations that are implemented to optimize the overall performance of the memory device 110, such as a garbage collection operation (GC), a wear leveling (WL) operation, and a bad block management (BBM) operation.

The memory controller 120 may control the operation of the memory device 110 at the request of a host. Alternatively, the memory controller 120 may control the operation of the memory device 110 even in the absence of a request from the host when it performs such background operations of the memory device.

The memory controller 120 and the host may be separate devices. In some implementations, the memory controller 120 and the host may be integrated in a single device. In the following description, the memory controller 120 and the host are discussed as separate devices for example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and commands from the control circuit 123.

The control circuit 123 may be configured to control the operation of the memory device 110. For example, the control circuit 123 may include a processor 124 and a working memory 125. The control circuit 123 may further include an error detection/correction circuit (ECC circuit) 126.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may perform a function of a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 (storage device) and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. For example, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this patent document, a sector may refer to a data unit that is smaller than the read unit (page) of a flash memory. Sectors constituting read data may be mapped to addresses.

The error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable. The error detection/correction circuit 126 may provide information (e.g., address of uncorrectable sector) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

The above-mentioned constituent elements 121, 122, 124, 125, and 126 of the memory controller 120 are only provided as examples. It is noted that some of the above-mentioned constituent elements 121, 122, 124, 125, and 126 of the memory controller 120 may be omitted, or some of the above-mentioned constituent elements 121, 122, 124, 125, and 126 of the memory controller 120 may be integrated into a single element. In some implementations, one or more other constituent elements may be added to the memory controller 120.

Figure 2:
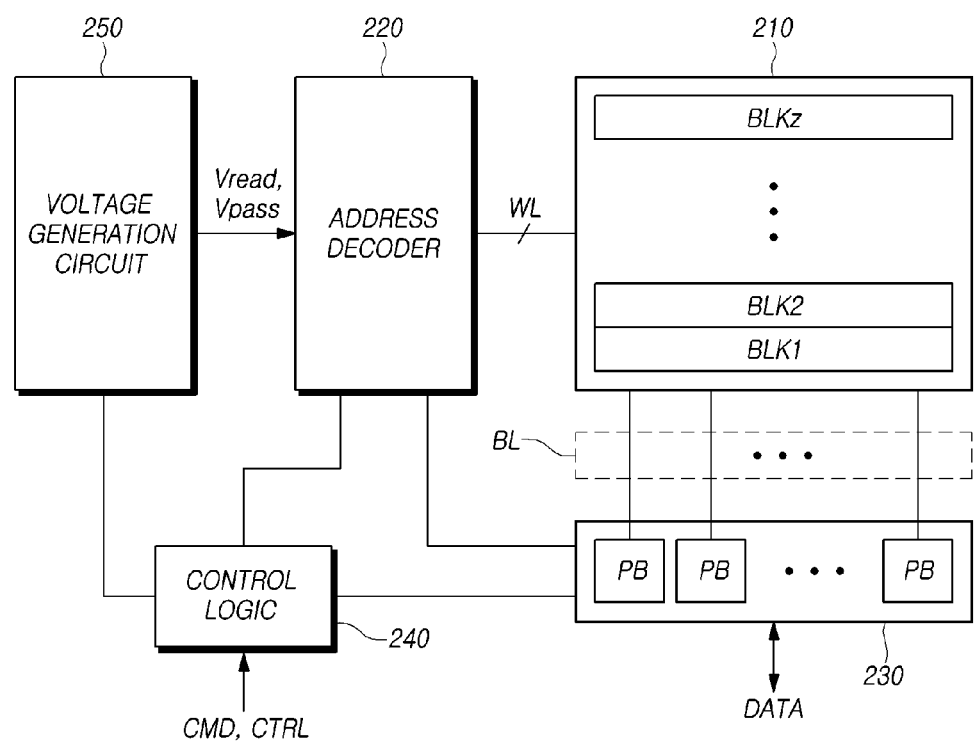
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be arranged in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may apply, during a read operation, the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change in the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array

210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
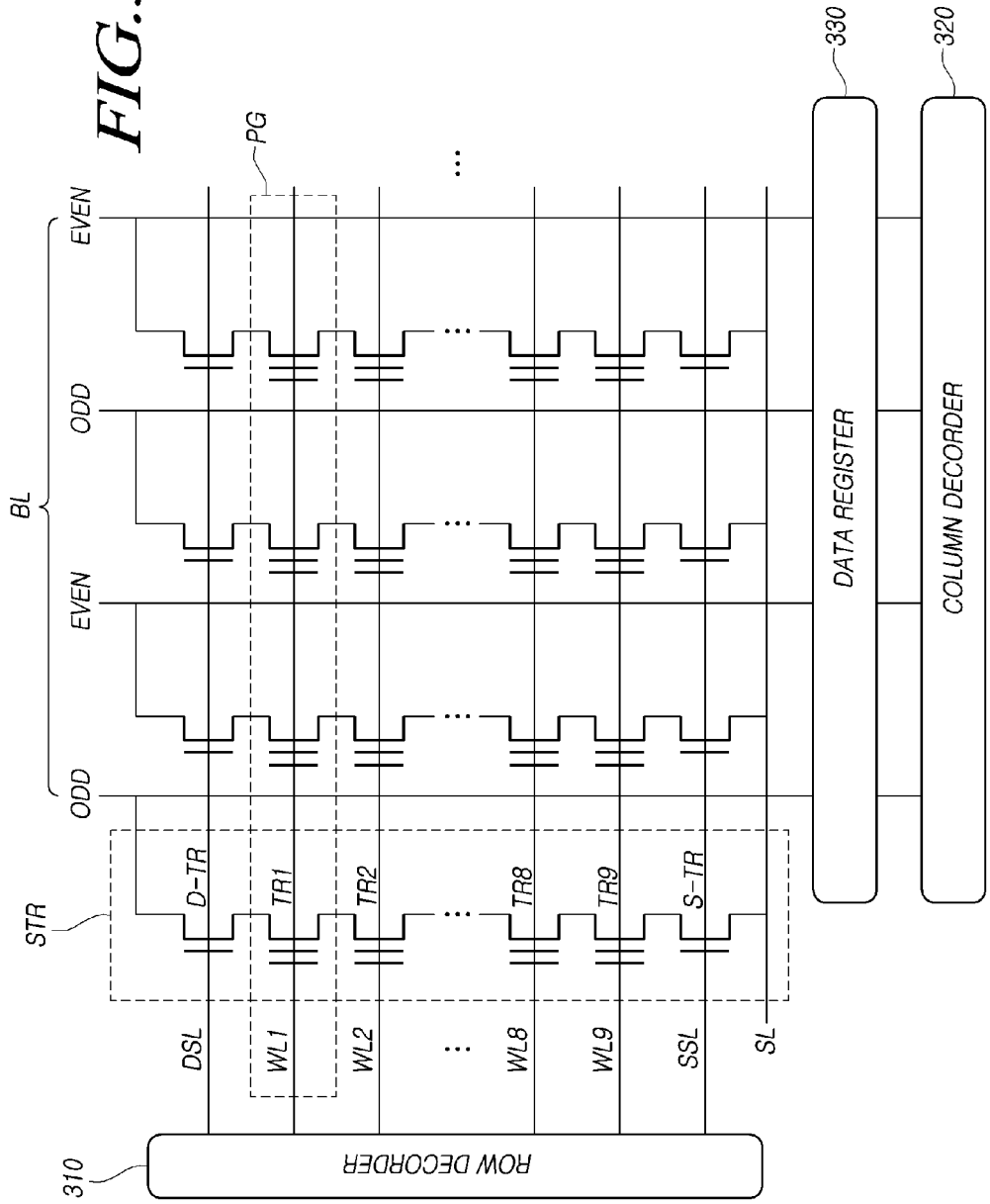
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

In some implementations, the memory device 110 has a core area in which memory cells MC are arranged, and an auxiliary area (e.g., the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit for performing program and read operations, and all memory cells MC within the same page PG may perform simultaneously the program operation and read operations.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

The data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. The multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR and the data register 330. The second selection transistor S-TR is used as a switch circuit that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
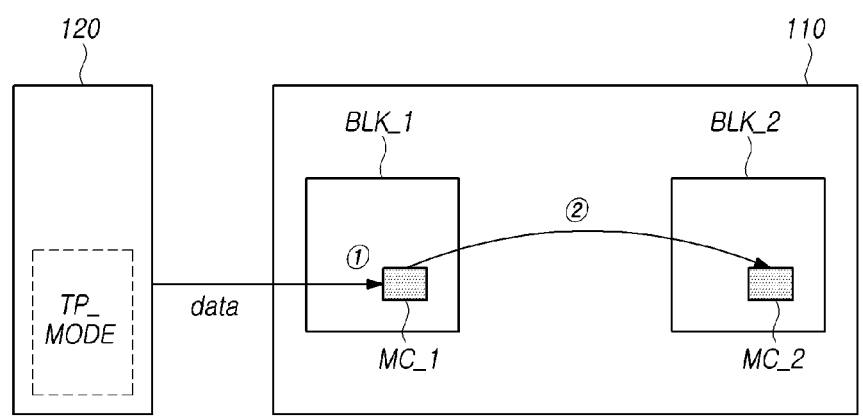
FIG. 4 is a diagram illustrating operations of a memory device based on embodiments of the disclosed technology.

FIG. 4 is a diagram illustrating operations of a memory device 110 based on some embodiments of the disclosed technology.

In some implementations, the memory device 110 may include a first memory block BLK_1 and a second memory block BLK_2. Each of the first memory block BLK_1 and the second memory block BLK_2 is one of memory blocks described with reference to FIG. 1.

In some implementations of the disclosed technology, when writing data to the memory device 110, a memory controller 120 may write data to a memory location first and then migrate the data to another memory location. For example, the memory device 110 may first write data into a first memory cell MC_1 included in the first memory block BLK_1 as shown in FIG. 4.

In some implementations, in a turbo program mode, program operations can be performed using a reduced number of incremental-step-pulse program (ISPP) program pulses. The memory controller 120 may determine whether to set or reset a turbo program mode TP_MODE, and, in the turbo program mode, may determine the number of ISPP program pulses to be applied to the first memory block BLK_1. The memory controller 120 may provide information indicating as to whether the turbo program mode TP_MODE is in use or not with respect to the memory device 110.

The memory device 110 may write data in the first memory cell MC_1 included in the first memory block BLK_1.

The first number of ISPP program pulses to be applied to the first memory cell MC_1 during a program operation on the first memory cell MC_1 may vary depending on whether or not the turbo program mode TP_MODE is in use as will be discussed below with reference to FIG. 5.

After data is written to the first memory cell MC_1, the memory device 110 may migrate the data in the first memory cell MC_1 to a second memory cell MC_2 included in the second memory block BLK_2.

During a program operation, the memory device 110 may first write data to the first memory cell MC_1 and then migrate the data from the first memory cell MC_1 to the second memory cell MC_2 when a specific condition is satisfied.

The number of data bits the first memory cell MC_1 can store may be smaller than the number of data bits the second memory cell MC_2 can store. For example, the first memory cell MC_1 may be programmed as a single level cell (SLC), and the second memory cell MC_2 may be programmed as a multi-level cell (MLC), triple-level cell (TLC), or quad-level cell (QLC) or a higher level cell. As another example, the first memory cell MC_1 may be programmed as a MLC, and the second memory cell MC_2 may be programmed as a TLC or QLC.

In general, SLC program operations have a faster speed than MLC, TLC, or QLC program operations, and MLC program operations have a faster speed than TLC, or QLC program operations. In some implementations of the disclosed technology, when writing data to TLC or QLC (or MLC) memory cells, the memory controller 120 takes advantage of the faster speed of SLC (or MLC) program operations in performing MLC, TLC, or QLC program operations, by writing data to SLC (or MLC) memory cells first and then migrating the data from the SLC (or MLC) memory cells to MLC, TLC, or QLC memory cells. In the example discussed above, the number of data bits the first memory cell MC_1 stores is smaller than the number of data bits the second memory cell MC_2 stores because the number of ISPP program pulses that will be applied to the first memory cell MC_1 is smaller than that of the second memory cell MC_2, and thus the program speed of the first memory cell MC_1 is faster than that of the second memory cell MC_2.

In this way, the memory system implemented based on some embodiments of the disclosed technology can increase the write speed while maintaining its high data storage capacity by utilizing two-step program operations. That is, data is first written to the first memory cell MC_1 at a higher program speed, and then later the data is migrated from the first memory cell MC_1 to the second memory cell MC_2, which has a higher data storage capacity.

Hereinafter, an operation of the memory device 110 applying a program pulse in order to write data to the first memory cell MC_1 and the second memory cell MC_2 will be described.

Figure 5:
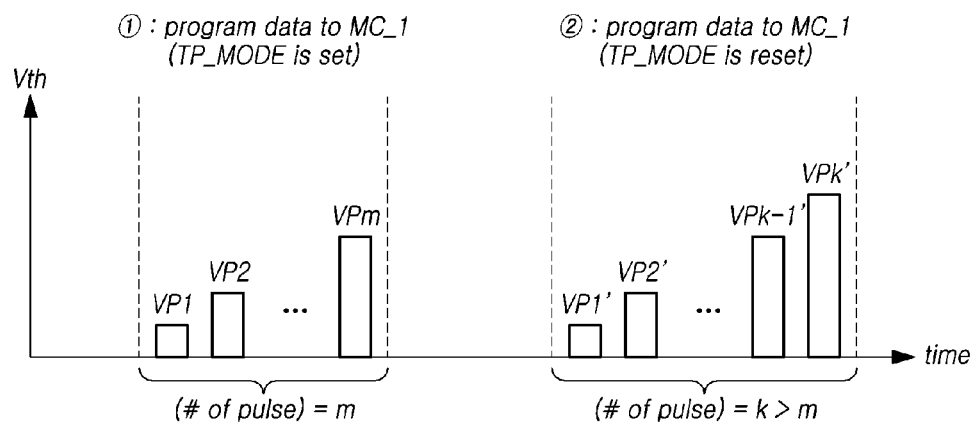
FIG. 5 is a diagram illustrating an operation of a memory device based on embodiments of the disclosed technology applying a program pulse to a first memory cell.

FIG. 5 is a diagram illustrating an operation of the memory device 110 based on some embodiments of the disclosed technology applying a program pulse to the first memory cell MC_1.

When writing data to the first memory cell MC_1, the memory device 110 may use an incremental step pulse program (ISPP) method.

The ISPP is a program and verify strategy using program voltages that are increased by a step voltage. For example, a memory cell is programmed using i (i is a natural number) program pulses, the magnitude of which gradually increases, are applied to a control gate of the memory cell. Verification voltages are applied between program voltages to verify whether the memory cell has been programmed to a desired threshold voltage, and this process is repeated until it is verified that the memory cell has been programmed.

Data written by the ISPP has a smaller threshold voltage distribution of the memory cell, thereby reducing the error rate in the data, and the reliability of the program operation increases.

However, the ISPP scheme iteratively applies program voltage pulses and verify voltage pulses, the time it takes to complete the program operation increases in proportion to the number of program pulses applied to the memory cell.

Referring to FIG. 5, when writing data to the first memory cell MC_1 in the turbo program mode TP_MODE (turbo program mode "set"), the memory device 110 may apply m ISPP program pulses VP1, VP2, . . . , VPm (m is an integer equal to or larger than 0, and is referred to as "first pulse number") to the first memory cell MC_1.

On the other hand, when writing data to the first memory cell MC_1 outside the turbo program mode TP_MODE (turbo program mode "reset"), the memory device 110 may apply k ISPP program pulses VP1', VP2', ..., VPk−1', VPk' (k is an integer equal to or larger than 0, k is) to the first memory cell MC_1.

The first pulse number (m) is smaller than k. That is, the memory device 110 may reduce the number of IPSS program pulses applied to the first memory cell MC_1, increasing the program speed in the turbo program mode TP_MODE (turbo program mode "set").

When writing data to the first memory cell MC_1 included in the first memory block BLK_1, the memory device 110 may apply m ISPP program pulses VP1, VP2, ..., VPm (m is an integer equal to or larger than 0) to the first memory cell MC_1. In addition, when migrating the data from the first memory cell MC_1 to the second memory cell MC_2 included in the second memory block BLK_2, the memory device 110 may apply n ISPP program pulses VP1', VP2', ..., VPn−1', VPn' (n is a natural number, and is referred to as "second pulse number") to the second memory cell MC_2.

The second pulse number n is larger than the first pulse number m. That is, when writing data to the first memory cell MC_1, the memory device 110 may reduce the number of ISPP program pulses applied to the first memory cell MC_1 to achieve a faster program speed. Since the first memory cell MC_1, which stores a small number of data bits, can complete program operations faster than memory cells that store a larger number of data bits, the memory device 110 may reduce the number of ISPP program pulses applied to the first memory cell MC_1, thereby achieving a faster program speed.

In addition, when migrating the data from the first memory cell MC_1 to the second memory cell MC_2, more ISPP program pulses will be applied to the second memory cell MC_2 to reduce the possibility that errors will occur in the data.

This may secure at least a predetermined level of reliability (e.g. 1 year) of the data stored in the second memory cell MC_2.

Figure 6:
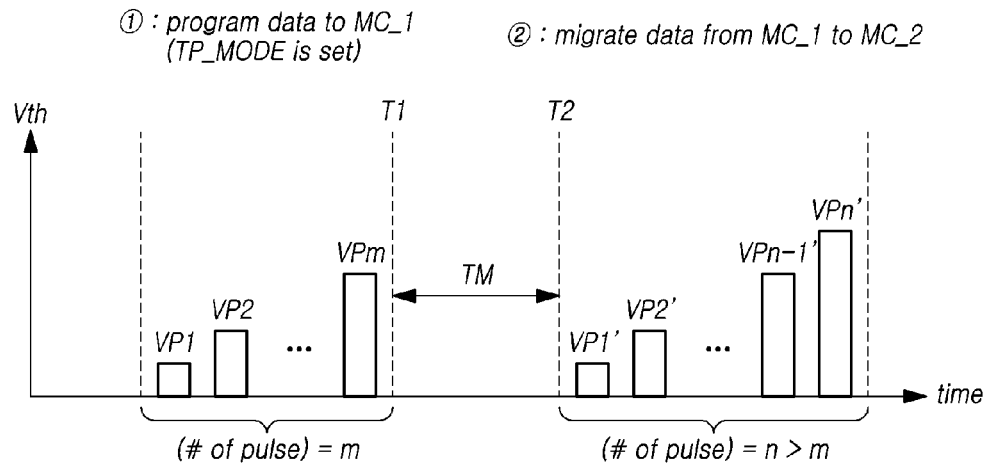
FIG. 6 is a diagram illustrating a maximum maintenance time in some embodiments of the disclosed technology.

FIG. 6 is a diagram illustrating a maximum maintenance time MT based on some embodiments of the disclosed technology.

Referring to FIG. 6, when writing data to the first memory cell MC_1 included in the first memory cell MC_1 in the turbo program mode TP_MODE (turbo mode "set"), the memory device 110 may apply m ISPP program pulses VP1, VP2, ..., VPm (m is an integer equal to or larger than 0, and is referred to as "first pulse number") to the first memory cell MC_1. In addition, when migrating the data from the first memory cell MC_1 to the second memory cell MC_2 included in the second memory block BLK_2, the memory device 110 may apply n ISPP program pulses VP1', VP2', ..., VPn−1', VPn' (n is a natural number, and is referred to as "second pulse number") to the second memory cell MC_2.

The second pulse number n is larger than the first pulse number m. That is, when migrating the data from the first memory cell MC_1 to the second memory cell MC_2, the memory device 110 may increase the second pulse number, which is the number of ISPP program pulses applied to the second memory cell MC_2, and the second pulse number is larger than the first pulse number, reducing the error rate in the written data.

This may secure at least a predetermined level of reliability (e.g. 1 year) of the data stored in the second memory cell MC_2.

Referring to FIG. 6, a delay may occur between the point in time at which the memory device 110 writes data to the first memory cell MC_1 and the point in time at which the memory device 110 migrates the data from the first memory cell MC_1 to the second memory cell MC_2.

For example, the memory device 110 may delay the data migration from the first memory cell MC_1 to the second memory cell MC_2, in order to perform another pending operation having a higher priority (e.g., a read operation). As another example, in order to minimize a negative impact of the migrating operation on the performance of the memory system, the memory device 110 may perform the data migration operation from the first memory cell MC_1 to the second memory cell MC_2 when a specific condition is satisfied.

Therefore, once the memory device 110 writes data to the first memory cell MC_1, the data remains in the first memory cell MC_1 until the memory device 110 migrates the data to the second memory cell MC_2. The maximum time between the first point in time T1 at which data is written to the first memory cell MC_1 and the second point in time T2 at which the data is migrated to the second memory cell MC_2 can be defined as a maximum maintenance time TM. That is, the data written to the first memory cell MC_1 can be retained for the maximum maintenance time MT.

The first pulse number is the number of ISPP program pulses applied to the first memory cell MC_1 when data is written to the first memory cell MC_1, and the memory device 110 may determine on the basis of the maximum maintenance time TM.

In some implementations, the maximum maintenance time TM may be determined by the memory controller 120. The memory controller 120 may notify the memory device 110 of the maximum maintenance time TM.

As another example, the maximum maintenance time TM may be determined based on the history of a previously used maintenance time. For example, if the history of a previously used maintenance time is 3 hours, 6 hours, and 1 day, the maximum maintenance time TM may be set to 1 day.

In order for the data to be normally migrated from the first memory cell MC_1 to the second memory cell MC_2, the data should be retained in the first memory cell MC_1 during the above-mentioned maximum maintenance time TM. Therefore, the memory device 110 may apply a sufficient number of ISPP program pulses as the first pulse number so that the data can be retained in the first memory cell MC_1 at least during the maximum maintenance time TM.

The first pulse number may increase in proportion to an increase in the maximum maintenance time TM. For example, the first pulse number value is larger when data needs to be retained in the first memory cell MC_1 for a maximum of two days than when data needs to be retained in the first memory cell MC_1 for a maximum of one day.

FIG. 7 is a diagram illustrating an example of the first pulse number based on the maximum maintenance time TM in some embodiments of the disclosed technology.

Referring to FIG. 7, if the maximum maintenance time TM is less than one day, the first pulse number may be set to "1." If the maximum maintenance time TM is equal to or longer than one day and less than three days, the first pulse number may be set to "3." If the maximum maintenance time TM is equal to or longer than three days and less than seven days, the first pulse number may be set to "5." If the maximum maintenance time TM is equal to or longer than seven days, the first pulse number may be set to "7." However, it is to be noted that the first pulse number and the maximum maintenance time TM are shown in FIG. 7 as an example, and the maximum maintenance time TM and the first pulse number associated with the maximum maintenance time TM may vary.

Figure 8:
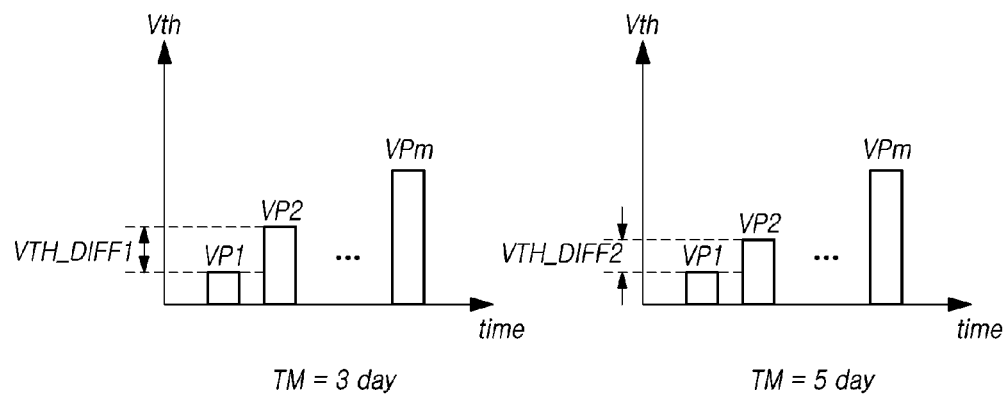
FIG. 8 is a diagram illustrating an example of a voltage difference between ISPP pulses based on the maximum maintenance time in some embodiments of the disclosed technology.

FIG. 8 is a diagram illustrating an example of a voltage difference between ISPP pulses based on the maximum maintenance time TM in some embodiments of the disclosed technology.

Referring to FIG. 8, a voltage difference between ISPP program pulses applied when data is written to the first memory cell MC_1 may be determined on the basis of the above-mentioned maximum maintenance time TM.

For example, it will be assumed that a voltage difference between ISPP program pulses when the maximum maintenance time TM is three days is a first voltage difference VTH_DIFF1, and a voltage difference between ISPP program pulses when the maximum maintenance time TM is five days is a second voltage difference VTH_DIFF2.

The magnitude of the first voltage difference VTH_DIFF1 may be larger than the magnitude of the second voltage difference VTH_DIFF2. That is, the larger the maximum maintenance time TM, the smaller the voltage difference between ISPP program pulses applied when data is written to the first memory cell MC_1.

In some implementations, the memory device 110 may use various methods to determine the point in time to migrate the data programmed in the first memory cell MC_1 to the second memory cell MC_2. A specific embodiment regarding the same will now be described.

Figure 9:
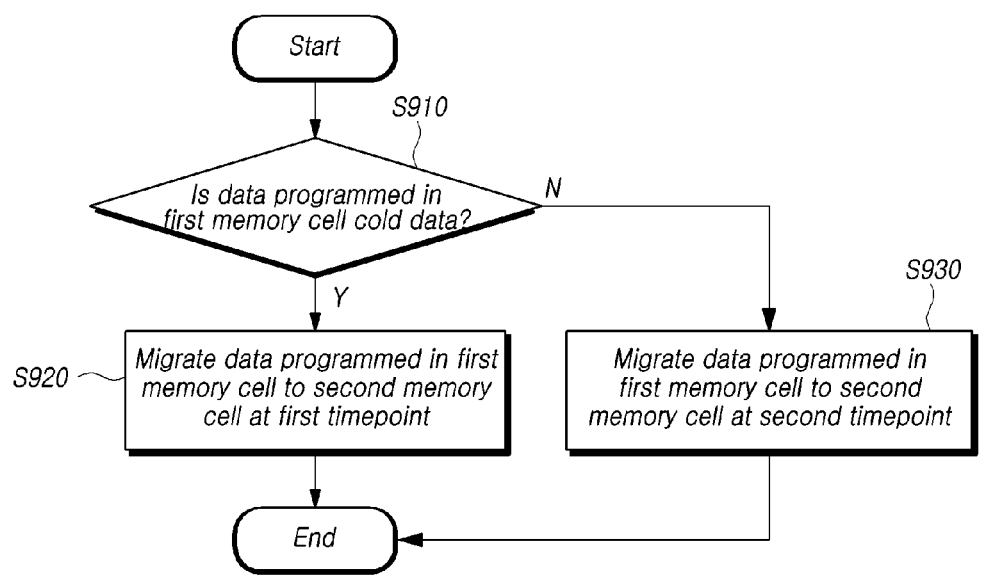
FIG. 9 is a flowchart illustrating an example of an operation of migrating data from a first memory cell to a second memory cell in some embodiments of the disclosed technology.

FIG. 9 is a flowchart illustrating an example of the operation of migrating data programmed in the first memory cell MC_1 to the second memory cell MC_2 in some embodiments of the disclosed technology.

Referring to FIG. 9, the memory device 110 may differently determine the point in time to migrate data written to the first memory cell MC_1 to the second memory cell MC_2 based on whether or not the data written to the first memory cell MC_1 is cold data. In some implementations, the cold data refers to data that is infrequently accessed, as compared to hot data that is frequently accessed.

First, the memory device 110 may determine whether or not the data stored in the first memory cell MC_1 is cold data (S910). The cold data refers to data accessed by the host HOST with a low frequency. In contrast, warm data or hot data refers to data accessed by the host HOST with a high frequency.

For example, the memory device 110 may determine that the data stored in the first memory cell MC_1 is cold data if the number of times the data stored in the first memory cell MC_1 is read during a configured unit time is less than a configured threshold read number, and may determine that the data stored in the first memory cell MC_1 is warm data or hot data if the same is equal to/higher than the configured threshold read number.

As another example, the memory device 110 may determine whether or not the data stored in the first memory cell MC_1 is cold data on the basis of a command, from the memory controller 120, indicating whether or not the data stored in the first memory cell MC_1 is cold data.

If the data programmed in the first memory cell MC_1 is cold data (Y in S910), the memory device 110 may migrate the data stored in the first memory cell MC_1 to the second memory cell MC_2 at a first time point (S920).

On the other hand, if the data stored in the first memory cell MC_1 is not cold data (N in S910), the memory device 110 may migrate the data stored in the first memory cell MC_1 to the second memory cell MC_2 at a second time point (S930).

The second time point comes after the first time point. That is, the timepoint at which the data stored in the first memory cell MC_1 is migrated if the same is cold data comes before the timepoint at which the data stored in the first memory cell MC_1 is migrated if the same is warm data or hot data. This is because cold data, which is accessed by the host HOST with a low frequency, is more preferably stored in the second memory block BLK_2 which can store a large amount of data than in the first memory block BLK_1 which can be accessed at a high rate.

Figure 10:
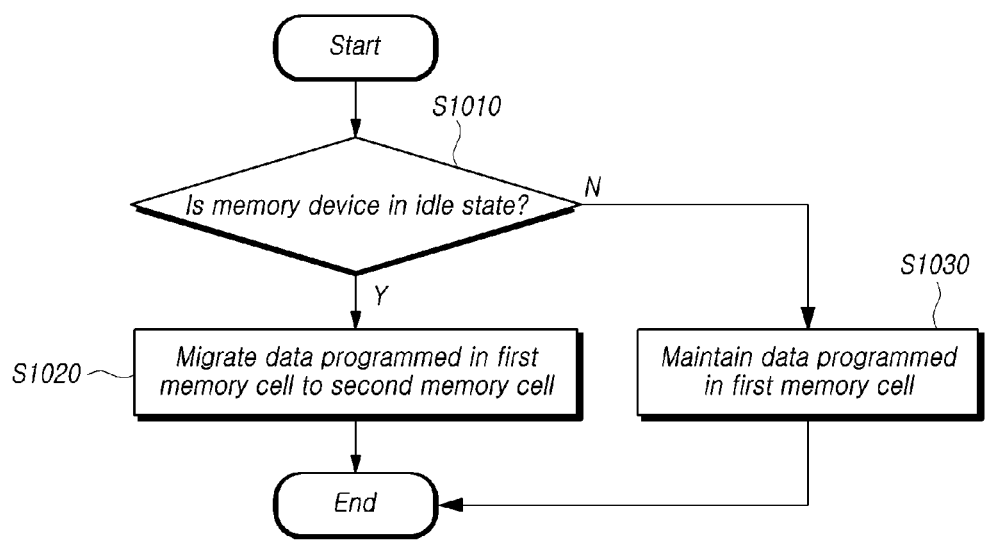
FIG. 10 is a flowchart illustrating another example of the operation of migrating data from the first memory cell to the second memory cell in some embodiments of the disclosed technology.

FIG. 10 is a flowchart illustrating another example of the operation of migrating data stored in the first memory cell MC_1 to the second memory cell MC_2 in some embodiments of the disclosed technology.

First, the memory device 110 may determine whether or not the memory device 110 is in an idle state (S1010).

The idle state refers to a state in which the memory device 110 performs no operation requested by the host HOST or the memory controller 120 (for example, read/program/erase operation or background operation such as garbage collection, wear leveling, or read reclaim).

If the memory device 110 is in an idle state (Y in S1010), the memory device 110 may migrate the data stored in the first memory cell MC_1 to the second memory cell MC_2 (S1020). This is because the migrating operation does not affect any operation requested by the host HOST or the memory controller 120.

On the other hand, if the memory device 110 is not in an idle state (N in S1010), the memory device 110 may maintain the data stored in the first memory cell MC_1 intact, and may not migrate the same to the second memory cell MC_2 (S1030).

Figure 11:
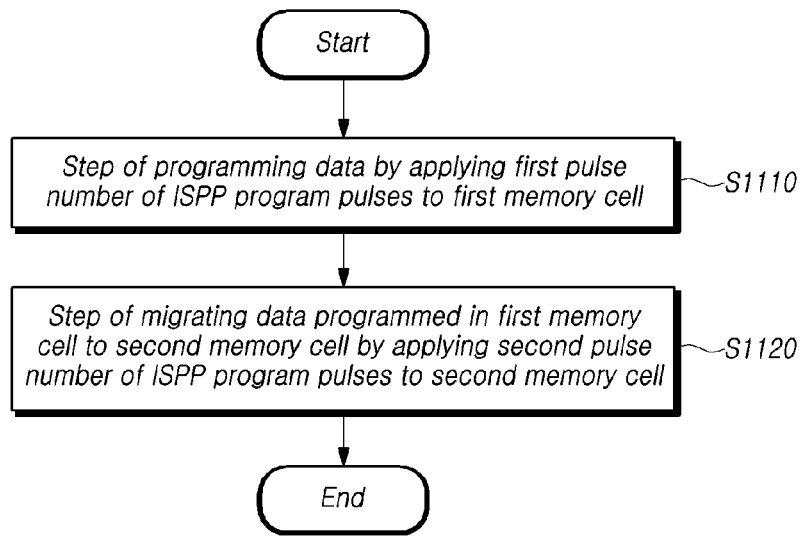
FIG. 11 is a flowchart illustrating a method for operating a memory device based on some embodiments of the disclosed technology.

FIG. 11 is a flowchart illustrating a method for operating a memory device 110 based on some embodiments of the disclosed technology.

The method for operating a memory device 110 may include a step of programming data by applying a first pulse number of ISPP program pulses to a first memory cell MC_1 included in a first memory block BLK_1 (S1110). A turbo program mode TP_MODE may have been set in this state, the turbo program mode TP_MODE being a mode for determining the number of ISPP program pulses applied when data is written to the first memory block BLK_1.

In addition, the method for operating a memory device 110 may include a step of migrating the data from the first memory cell MC_1 to a second memory cell MC_2 included in a second memory block BLK_2 by applying a second pulse number of ISPP program pulses to the second memory cell MC_2 (S1120).

The first pulse number is smaller than the number of ISPP program pulses applied to the first memory cell MC_1 when data is written to the first memory cell MC_1 in a state in which the turbo program mode TP_MODE is reset.

The second pulse number is larger than the first pulse number.

The bit number of the data stored in the first memory cell MC_1 may be smaller than the bit number of the data stored in the second memory cell MC_2.

The first pulse number may be determined on the basis of the maximum value of the maximum maintenance time, that is, the maximum value of the time during which the data written to the first memory cell MC_1 can be maintained in the first memory cell MC_1.

The voltage difference between ISPP program pulses applied when data is written to the first memory cell may be determined on the basis of the above-mentioned maximum maintenance time.

Figure 12:
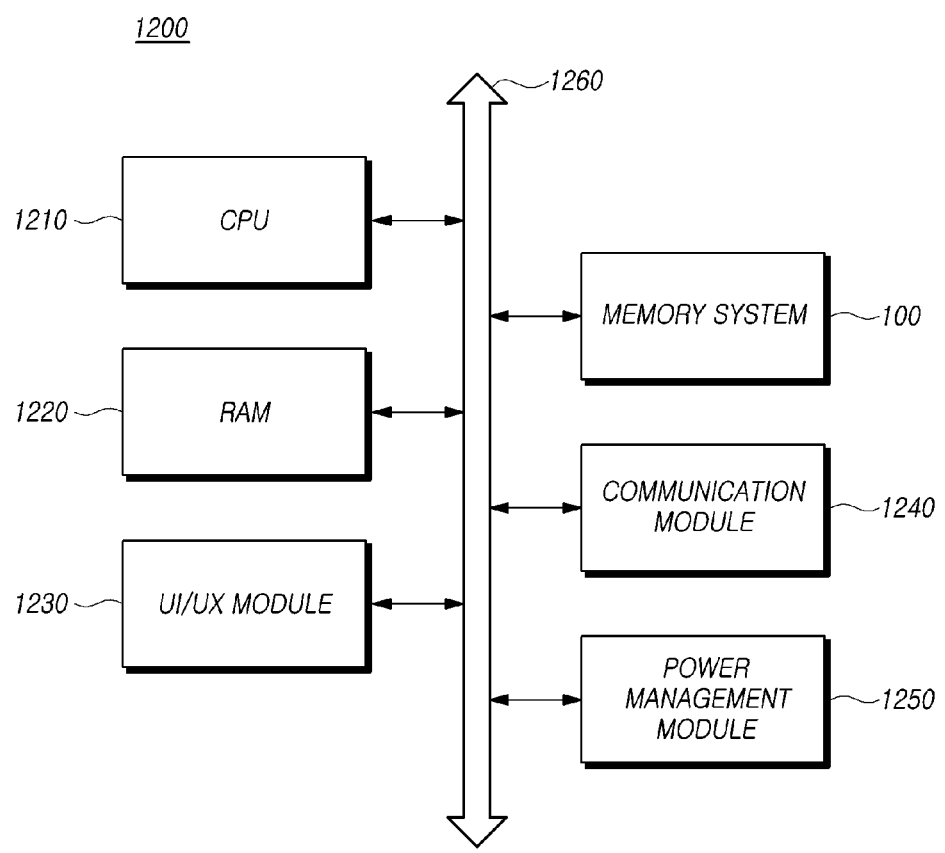
FIG. 12 is a diagram illustrating the configuration of a computing system based on some embodiments of the disclosed technology.

FIG. 12 is a diagram illustrating the configuration of a computing system 1200 based on an embodiment of the disclosed technology.

Referring to FIG. 12, the computing system 1200 based on an embodiment of the disclosed technology may include: a memory system 100 electrically connected to a system bus 1260; a CPU 1210 configured to control the overall operation of the computing system 1200; a RAM 1220 configured to store data and information related to operations of the computing system 1200; a user interface/user experience (UI/UX) module 1230 configured to provide the user with a user environment; a communication module 1240 configured to communicate with an external device as a wired and/or wireless type; and a power management module 1250 configured to manage power used by the computing system 1200.

The computing system 1200 may be a personal computer (PC) or may include a mobile terminal such as a smartphone, a tablet or various electronic devices.

The computing system 1200 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

In some embodiments of the disclosed technology described above, the operation delay time of the memory system may be minimized. In addition, based on an embodiment of the disclosed technology, an overhead occurring in the process of calling a specific function may be minimized. Although various embodiments of the disclosed technology have been described with various specific features, modification, variations and enhancements of the disclosed embodiments and other embodiments may be made based on what is disclosed and illustrated in this patent document.

What is claimed is:

1. A memory system comprising:
a memory device comprising a first memory block and a second memory block, each of the first and second memory blocks including memory cells for storing data and operable to perform an operation on one or more memory cells, including a read operation for reading data stored in one or more memory cells and a program operation for writing new data into one or more memory cells; and
a memory controller in communication with the memory device and configured to control the memory device to perform an operation, wherein the memory controller is configured to determine whether to set or reset a turbo program mode, and configured to determine, in the turbo program mode, a number of program pulses applied when data is written to the first memory block, wherein the memory device is configured to:
apply a first number of program pulses to a first memory cell included in the first memory block when writing data into the first memory cell in a state in which the turbo program mode is set; and
apply a second number of program pulses to a second memory cell included in the second memory block when migrating the data from the first memory cell to the second memory cell,
wherein the first number of program pulses is smaller than a number of program pulses applied when data is written to the first memory cell in a state in which the turbo program mode is reset,
wherein the second number of program pulses is larger than the first number of program pulses, and
wherein the first memory cell is in the turbo program mode when the turbo program mode is set and the first memory cell is not in the turbo mode when the turbo program mode is reset.

2. The memory system of claim 1, wherein a number of data bits stored in the first memory cell is smaller than a number of data bits stored in the second memory cell.

3. The memory system of claim 1, wherein the memory device is configured to determine the first number of program pulses based on a maximum maintenance time corresponding to a maximum time during which data is retained in the first memory cell.

4. The memory system of claim 3, wherein the program pulses are incremental-step-pulse program voltage pulses, and wherein the memory device is configured to determine a voltage difference between the program pulses to be applied to the first memory cell based on the maximum maintenance time.

5. The memory system of claim 4, wherein the memory device is configured to differently determine a time point to migrate data programmed in the first memory cell to the second memory cell based on how frequently the data stored in the first memory cell is accessed.

6. The memory system of claim 1, wherein the memory device is configured to migrate data from the first memory cell to the second memory cell when the memory device is in an idle state.

7. A memory device comprising:
a first memory block including first memory cells for storing data and operable to perform a program operation for writing data into the memory cells; and
a second memory block including second memory cells for storing data and operable to perform a program operation for writing data into the memory cells,
wherein the memory device is configured to:
apply a first number of program pulses to a first memory cell included in the first memory block when writing data into the first memory cell in a state in which a turbo program mode is set, wherein the turbo program mode is configured to determine a number of program pulses to be applied to the first memory block;
apply a second number of program pulses to a second memory cell included in the second memory block when migrating the data from the first memory cell to the second memory cell,
wherein the first number of program pulses is smaller than a number of program pulses applied when data is written to the first memory cell in a state in which the turbo program mode is reset,
wherein the second number of program pulses is larger than the first number of program pulses, and wherein the first memory cell is in the turbo program mode when the turbo program mode is set and the first memory cell is not in the turbo mode when the turbo program mode is reset.

8. The memory device of claim 7, wherein a number of data bits stored in the first memory cell is smaller than a number of data bits stored in the second memory cell.

9. The memory device of claim 7, wherein the memory device is configured to determine the first number of program pulses based on a maximum maintenance time corresponding to a maximum time during which data is retained in the first memory cell.

10. The memory device of claim 9, wherein the program pulses are incremental-step-pulse program voltage pulses, and wherein the memory device is configured to determine a voltage difference between the program pulses to be applied to the first memory cell based on the maximum maintenance time.

11. The memory device of claim 10, wherein the memory device is configured to differently determine a time point to migrate data programmed in the first memory cell to the second memory cell based on how frequently the data stored in the first memory cell is accessed.

12. The memory device of claim 7, wherein the memory device is configured to migrate data from the first memory cell to the second memory cell when the memory device is in an idle state.

13. A method for operating a memory device comprising a first memory block and a second memory block, the method comprising:
  writing data by applying a first number of program pulses to a first memory cell included in the first memory block in a state in which a turbo program mode is set, wherein the turbo program mode is configured to determine a number of program pulses applied when data is written to the first memory block; and
  migrating the data from the first memory cell to a second memory cell included in the second memory block by applying a second number of program pulses to the second memory cell,
  wherein the first number of program pulses is smaller than a number of program pulses applied when data is written to the first memory cell in a state in which the turbo program mode is reset,
  wherein the second number of program pulses is larger than the first number of program pulses, and
  wherein the first memory cell is in the turbo program mode when the turbo program mode is set and the first memory cell is not in the turbo mode when the turbo program mode is reset.

14. The method of claim 13, wherein a number of data bits stored in the first memory cell is smaller than a number of data bits stored in the second memory cell.

15. The method of claim 13, wherein the first number of program pulses is determined based on a maximum maintenance time corresponding to a maximum time during which data is retained in the first memory cell.

16. The method of claim 15, wherein the program pulses are incremental-step-pulse program voltage pulses, and wherein a voltage difference between the program pulses to be applied to the first memory cell is determined based on the maximum maintenance time.

* * * * *